United States Patent [19]
Ishii

[11] Patent Number: 5,796,311
[45] Date of Patent: Aug. 18, 1998

[54] PHASE-LOCKED LOOP CIRCUIT

[75] Inventor: Katsuhiro Ishii, Tokyo, Japan

[73] Assignee: NEC Corporation, Tokyo, Japan

[21] Appl. No.: 788,653

[22] Filed: Jan. 24, 1997

[30] Foreign Application Priority Data

Jan. 26, 1996 [JP] Japan .................... 8-011577

[51] Int. Cl.$^6$ ...................................... H03L 7/00
[52] U.S. Cl. ................. 331/1 R; 331/1 A; 331/11; 331/17; 331/25
[58] Field of Search ............... 331/1 R, 1 A, 331/11, 17, 25

[56] References Cited

U.S. PATENT DOCUMENTS

| 5,216,387 | 6/1993 | Telewski et al. ............. 331/11 |
| 5,260,979 | 11/1993 | Parker et al. ............... 331/25 |
| 5,550,515 | 8/1996 | Liang et al. ............... 331/11 |

FOREIGN PATENT DOCUMENTS

5-110431   4/1993   Japan .
5-327492   12/1993   Japan .

*Primary Examiner*—David C. Nelms
*Assistant Examiner*—Trong Phan
*Attorney, Agent, or Firm*—Scully, Scott, Murphy & Presser

[57] ABSTRACT

A PLL circuit has a feedback loop including a plurality of feedback circuits in parallel and a combining circuit. The feedback circuits receives an output signal of the PLL circuit and produce feedback output signals, respectively. The combining circuit combines the feedback output signals into a feedback signal which is used to be compared to a reference signal. The feedback circuits in parallel each divide a frequency of the output signal by a predetermined number and the combining circuit performs logical OR of the feedback output signals.

16 Claims, 6 Drawing Sheets

PHASE-LOCKED LOOP CIRCUIT

BACKGROUND OF THE INVENTION

1. Field of the invention

The present invention generally relates to a PLL (Phase-Locked Loop) circuit and, in particular, to a PLL circuit suitable for a device which requires noise immunity such as a radio mobile communication device.

2. Description of the Related Art

In a mobile communications system, a mobile terminal in provided with a PLL frequency synthesizer which is capable of changing a frequency channel at hand-over with reliability. Especially, in the case of burst transmitting and receiving as in a time division multiple access (TDMA) system, it is important to switch a frequency channel at high speed. In order to achieve a high-speed channel change with reduced power consumption, several PLL synthesizers have been proposed. For example, see Japanese Patent Unexamined Publication Nos. 5-327492 and 5-110431.

Figure 1:
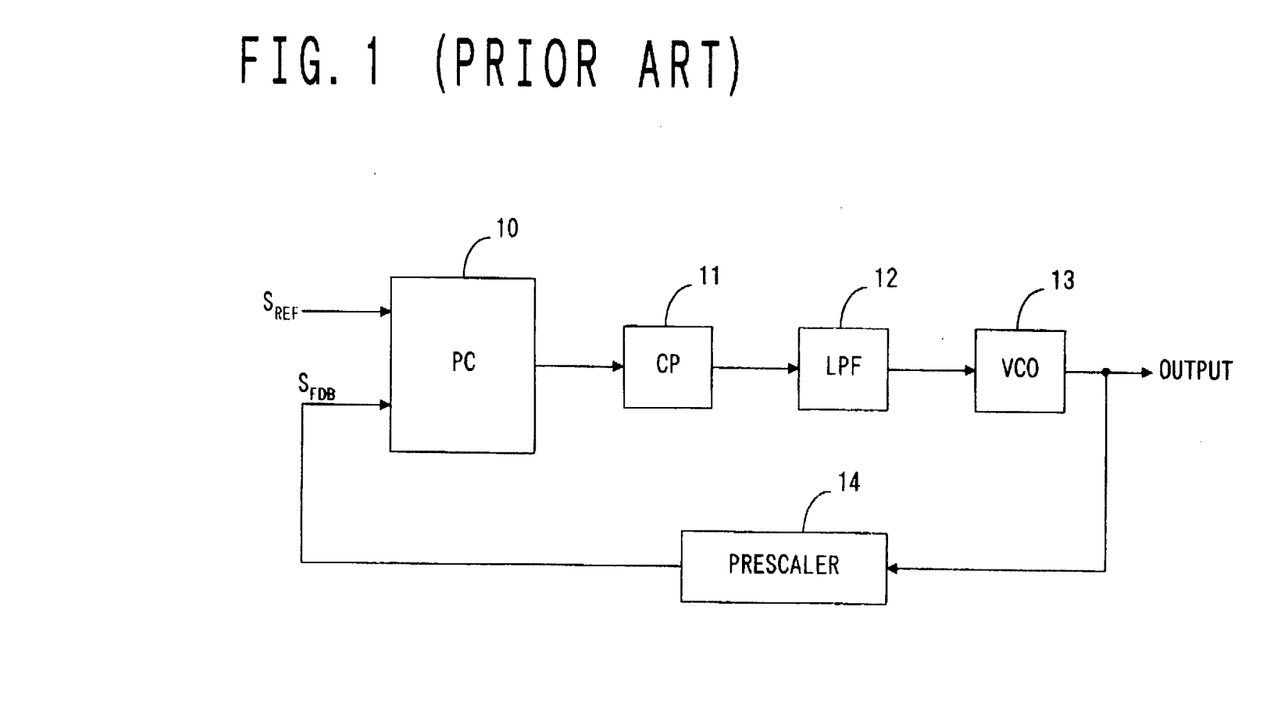
FIG. 1 is a block diagram showing a conventional PLL synthesizer.

These conventional PLL synthesizers employ a well-known PLL circuit as shown in FIG. 1. More specifically, a phase comparator 10 detects the phase difference between a reference signal $S_{REF}$ and a feedback signal $S_{FDB}$ and then a voltage corresponding to the phase difference is output as a control signal to a Voltage Controlled Oscillator (VCO) 13 through a charge pump (CP) 11 and a low-pass filter (LPF) 12. A part of the output of the VCO 13 is fed back to the phase comparator 10 through a prescaler 14 which frequency-divides the output of the VCO 13 to produce the feedback signal $S_{FDB}$.

However, such a feedback circuit from the VCO 13 to the phase comparator 10 is easily affected by external noises in the case of decreased feedback power supplied to the prescaler 14. Especially, for a battery-powered mobile terminal, it is necessary to ensure the sufficient output power of the VCO 13 without increasing the power consumption, which results in lower feedback power. Since the lower feedback power reduces the noise immunity of the feedback circuit, there is an increased possibility that the PLL circuit is activated by an undesirable external noise affecting the phase comparator. Therefore, the conventional PLL synthesizer has a disadvantage that the output frequency of the VCO becomes unstable and difficulty in ensuring the phase and frequency stability, especially in the case where the PLL synthesizer is used in noise surroundings.

SUMMARY OF THE INVENTION

An object of the present invention is to provide a PLL circuit which achieves high noise immunity.

Another object of the present invention is to provide a PLL circuit which is capable of reducing the effect of noise to stabilize the output frequency.

Still another object of the present invention is to provide a PLL circuit which is capable of stabilizing the output frequency even when an external noise is input to a feedback circuit.

According to a first aspect of the present invention, in a PLL circuit receiving a reference signal and generating an output signal based on a phase difference between the reference signal and a feedback signal, a feedback loop is comprised of a plurality of feedback circuits and a combining circuit. The plurality of feedback circuits are provided in parallel, receiving the output signal and producing feedback output signals, respectively. The combining circuit receives the feedback output signals from the feedback circuits and combines them to produce the feedback signal which is used to be compared to the reference signal. More specifically, the plurality of feedback circuits in parallel each divide a frequency of the output signal by a predetermined number to produce the feedback output signals, respectively. The combining circuit performs logical OR of the feedback output signals to produce the feedback signal.

As described above, the PLL circuit is provided with a plurality of feedback circuits in parallel through which the output signal is fed back for phase comparison. Therefore, when an external noise is mixed into one of the feedback circuits, the PLL circuit is kept in a synchronous steady state. Even when all feedback circuits are affected by noise, causing the PLL system to go out of the synchronous steady state, the system can return to the steady state in a very short time, achieving improved noise-immunity and frequency stability.

According to a second aspect of the present invention, the phase-locked loop circuit is further comprised of a switch connected to a predetermined feedback circuit of the feedback circuits so that the output signal is transferred to the predetermined feedback circuit only when the switch is closed. Preferably, the switch is normally opened so as to supply the sufficient input power to the other feedback circuits. When the other feedback circuits in parallel cannot provide enough stability, the switch is closed to form the feedback circuits in parallel, achieving a more stable output frequency.

According to a third aspect of the present invention, the feedback circuits have different input sensitivities. More specifically, in the case of each feedback circuit being a prescaler, the prescaler is provided with an input buffer amplifier having a different gain. Alternatively, each of the feedback circuits excepting a predetermined one is comprised of an amplifier with different gain and a prescaler connected in series so that the output signal is supplied to the amplifier before the prescaler.

Since the feedback circuits have different input sensitivities, even when one feedback circuit is affected by a large noise, another feedback circuit probably continues producing the feedback output signal. Therefore, the feedback signal is normally obtained.

DETAILED DESCRIPTION OF THE PREFERRED EMBODIMENTS

FIRST EMBODIMENT

Figure 2:
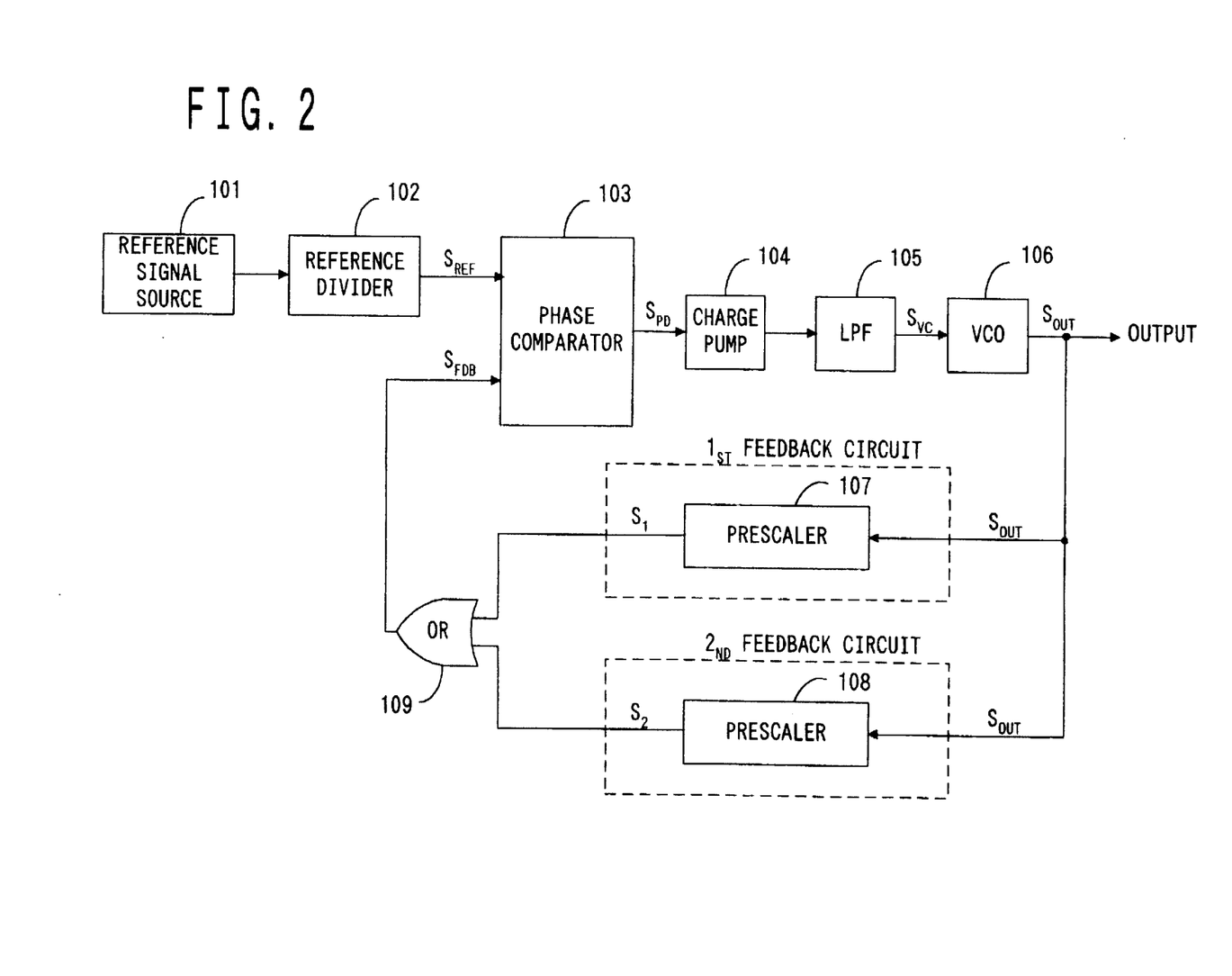
FIG. 2 is a block diagram showing a PLL synthesizer according to a first embodiment of the present invention.

Referring to FIG. 2, there is shown a PLL synthesizer in accordance with a first embodiment of the present invention. A reference signal source 101 generates a signal of a predetermined frequency and a frequency divider 102 divides it to produce a reference signal $S_{REF}$. A phase comparator 103 compares the phase of a feedback signal $S_{PDB}$ to that of the reference signal $S_{REF}$ to produce a pulse signal $S_{PD}$ whose pulse width corresponds to the difference in phase therebetween. Receiving the pulse signal $S_{PD}$ from the phase comparator 103, a charge pump 104 produces a difference signal corresponding to the pulse width of the pulse signal $S_{PD}$ and outputs it to the low pass filter 105. The low pass filter 105 smoothens the difference signal produced by the charge pump 104 to produce a control signal $S_{vc}$ which controls the frequency of a voltage controlled oscillator 106.

The voltage controlled oscillator 106 generates an output signal $S_{OUT}$ having a controlled frequency which branches out into an output of the PLL synthesizer and two input signals of first and second feedback circuits which are spatially separated and are comprised of prescalers 107 and 108, respectively. In this embodiment, the output signal $S_{OUT}$ is divided by the same number N in each of the prescalers 107 and 108 which are of the same circuit configuration including a predetermined number of flip-flop circuits in Series. The respective output signals $S_1$ and $S_2$ of the prescalers 107 and 108 are output to an OR gate 109 which is a logical implementation of an OR function. The OR thereof is output as the feedback signal $S_{FDB}$ to the phase comparator 103 to be compared to the reference signal $S_{REF}$.

Since a part of the output signal $S_{OUT}$ branches out into the two input signals of the prescalers 107 and 108, the power level of each input signal becomes smaller than that of the prior art. This causes each feedback circuit to become more sensitive to noise. More specifically, noise affects a PLL signal, particularly white noise affects the amplitude component of the signal, which causes the phase comparator to lose synchronization, resulting in the unstable output frequency of the VCO. As described before, a prescaler is comprised of a predetermined number of flip-flop circuits in series. The input sensitivity of the prescaler is determined by the amplitude component of the output signal. Therefore, in cases where the reduced pulse amplitude of the feedback signal is caused by noise, the prescaler cannot respond to that pulse. As a result, the prescaler produces the delayed timing of the feedback signal $S_{PDB}$.

However, two feedback circuits in parallel remarkably reduce the effect of noise on the phase comparator 103. An operation of the embodiment will be described in detail hereinafter.

Figure 3:
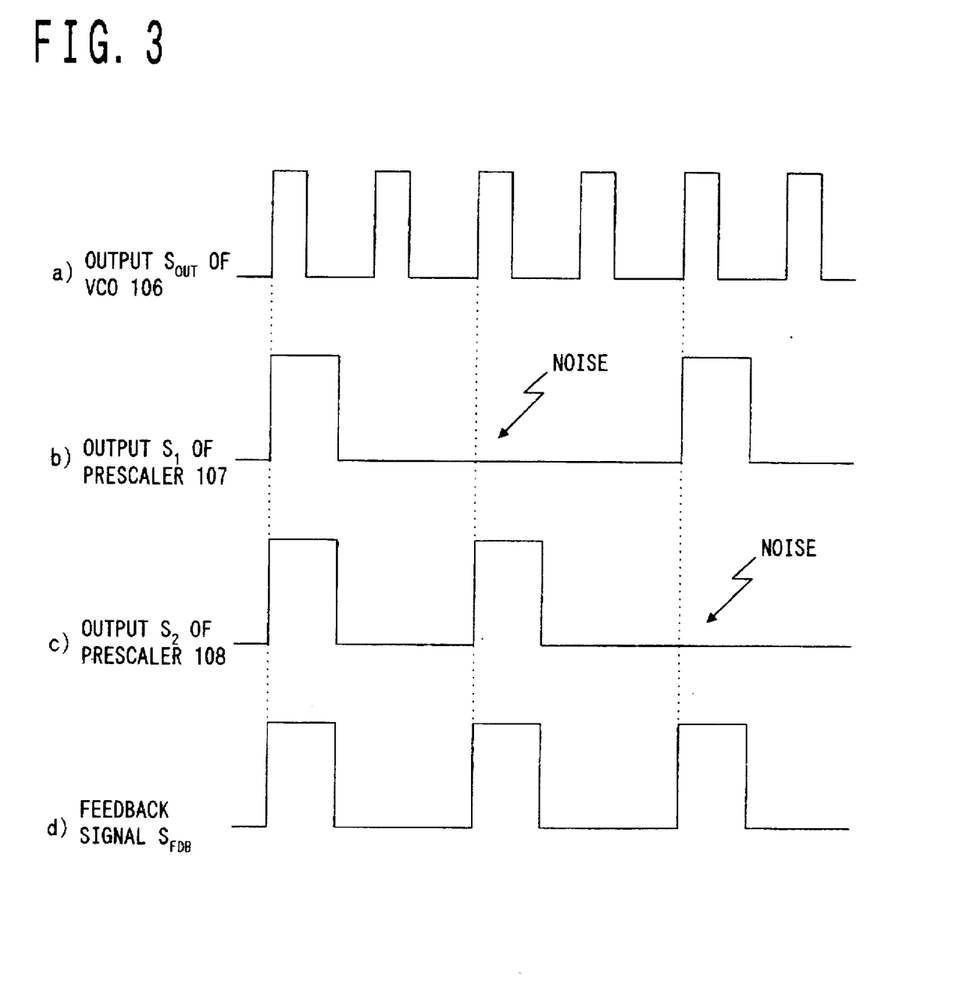
FIG. 3 is timing chart showing an operation of the first embodiment shown in FIG. 2.

Referring to FIG. 3, the output signal $S_{OUT}$ generated by the VCO 106 is supplied to the prescalers 107 and 108 where the output signal $S_{OUT}$ is divided by the same number N (in this figure, N=2) to produce the output signals $S_1$ and $S_2$. When one of the prescalers 107 and 108 is affected by noise, a pulse of that output signal is possibly lacked. However, since the respective output signals $S_1$ and $S_2$ of the prescalers 107 and 108 are ORed by the OR gate 109, a normal feedback signal $S_{FDB}$ is obtained and supplied to the phase comparator 103. Therefore, even when one of the two feedback circuit is affected by a large noise, the feedback signal $S_{PDB}$ is normally supplied to the phase comparator 103. Further, it is rare that pulses of both the output signals $S_1$ and $S_2$ are lacked at the same time for a long duration. As a result, the two prescalers connected in parallel remarkably reduce the effect of noise. Further, even when pulses of both the output signals $S_1$ and $S_2$ are lacked at the same time, the duration time is very short, resulting in the reduced response time required until it returns to steady state.

SECOND EMBODIMENT

Figure 4:
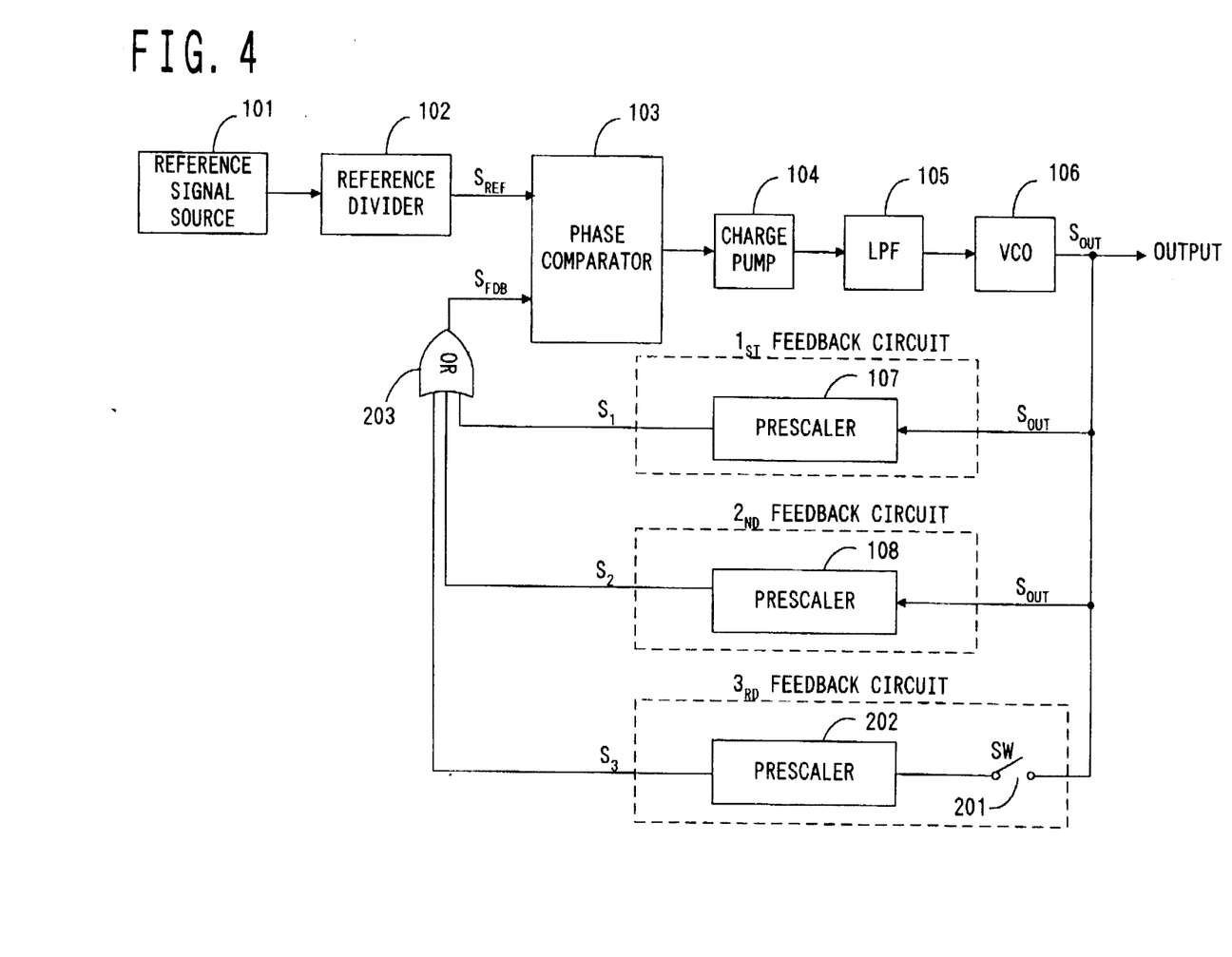
FIG. 4 is a block diagram showing a PLL synthesizer according to a second embodiment of the present invention.

Referring to FIG. 4, where circuit blocks similar to those previously described with reference to FIG. 2 are denoted by the same reference numerals, the PLL synthesizer according to the second embodiment is provided with three feedback circuits connected in parallel. The first and second feedback circuits are comprised of prescalers 107 and 108, respectively, and the third feedback circuit is comprised of a switch 201 and a prescaler 202. In this embodiment, the three prescalers 107, 108, and 202 have the same circuit configuration including a series of flip-flop circuits. The respective output terminals of the prescalers 107, 108 and 202 are connected to the input terminals of an OR gate 203. The OR thereof is output as the feedback signal $S_{FDB}$ to the phase comparator 103 to be compared to the reference signal $S_{REF}$.

When the switch 201 is on, the three prescalers 107, 108 and 202 are connected in parallel. When the switch 201 is off, only the two prescalers 107 and 108 are connected in parallel, which is the same as in the first embodiment of FIG. 2. In the case where the switch 201 is on, the output signal $S_{OUT}$ generated by the voltage controlled oscillator 106 is supplied to the three prescalers 107, 108, and 202. The output signal $S_{OUT}$ is divided by the same number N in each of the prescalers 107, 108 and 202. The respective output signals $S_1$, $S_2$ and $S_3$ of the prescalers 107, 108 and 202 are output to the OR gate 203 which outputs the OR thereof as the feedback signal $S_{FDB}$ to the phase comparator 103.

Pulses of the three output signals $S_1$, $S_2$ and $S_3$ are more rarely lacked at the same time for a long duration. Therefore, the three feedback circuits in parallel have higher noise immunity as compared with the two feedback circuits in parallel. However, it should be noted that the three input signals of the prescalers 107, 108 and 202 decrease in power level, which causes each feedback circuit to become more sensitive to noise as described before. Therefore, it is necessary to determine the number of feedback circuits in parallel taking into account the power level of the output signal $S_{OUT}$ and the total noise-immunity. Preferably, the switch 201 is normally off so as to supply the sufficient input power to the prescalers 107 and 108. When the two feedback circuits in parallel cannot provide enough stability, the switch 201 is on to form the three feedback circuits in parallel so as to obtain a more stable output frequency.

A switch like the switch 201 may be connected to another prescaler so that the output signal $S_{OUT}$ is selectively transferred to the prescalers.

THIRD EMBODIMENT

Figure 5:
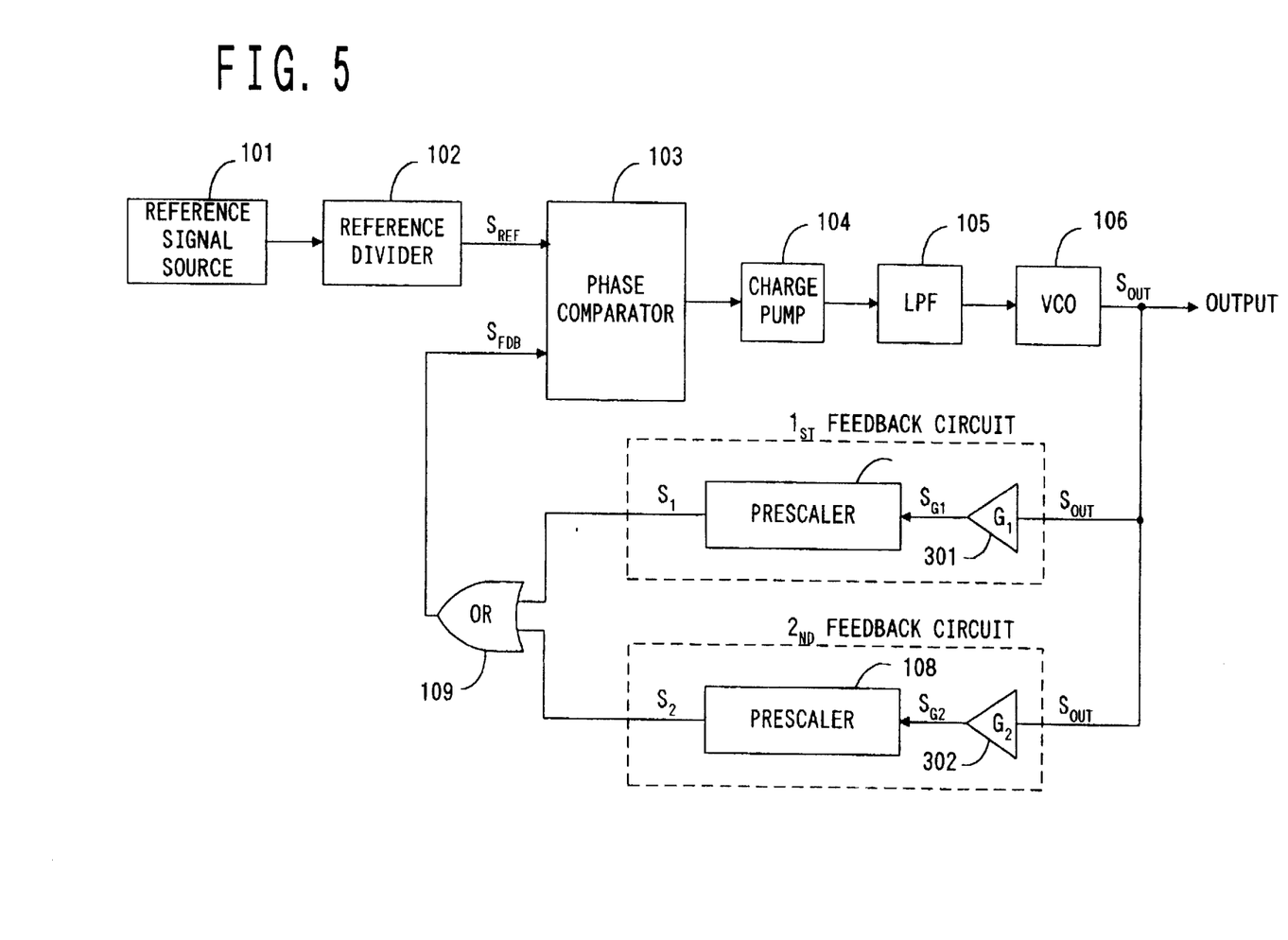
FIG. 5 is a block diagram showing a PLL synthesizer according to a third embodiment of the present invention.

Referring to FIG. 5, where circuit blocks similar to those previously described with reference to FIG. 2 are denoted by the same reference numerals, the PLL synthesizer according to the third embodiment is provided with two feedback circuits connected in parallel which have different input sensitivities. The first feedback circuit is comprised of the prescaler 107 and a variable-gain amplifier 301. Similarly, the second feedback circuit is comprised of the prescaler 108 and a variable-gain amplifier 302 which has a different gain. Needless to say, an input amplifier may be provided in one of the two feedback circuits so as to provide different input sensitivities therebetween. It is also possible that the respective prescalers are provided with different-gain input buffers therein.

These two feedback circuits in parallel with different input sensitivities allow more improved noise-immunity and response characteristics. The voltage controlled oscillator 106 generates the output signal $S_{OUT}$ which branches out into an output of the PLL synthesizer and two input signals of first and second feedback circuits with different input sensitivities. In this embodiment, the output signal $S_{OUT}$ is amplified by the amplifiers 301 and 302 with different gains $G_1$ and $G_2$ which produce two output signals $S_{G1}$ and $S_{G2}$, respectively. The two output signals $S_{G1}$ and $S_{G2}$ are divided by the same number N in both the prescalers 107 and 108. The respective output signals $S_1$ and $S_2$ of the prescalers 107 and 108 are output to the OR gate 109 which outputs the OR of the output signals $S_1$ and $S_2$ as the feedback signal $S_{FDB}$ to the phase comparator 103 to be compared to the reference signal $S_{REF}$.

As describe before, since the input sensitivity of a prescaler can be determined by the amplitude component of an input signal, in cases where the reduced pulse amplitude of the signal is caused by noise, the prescaler cannot respond to that pulse. Therefore, amplifying one input signal with higher gain remarkably reduce the effect of noise on the phase comparator 103. An operation of the embodiment will be described in detail hereinafter.

Figure 6:
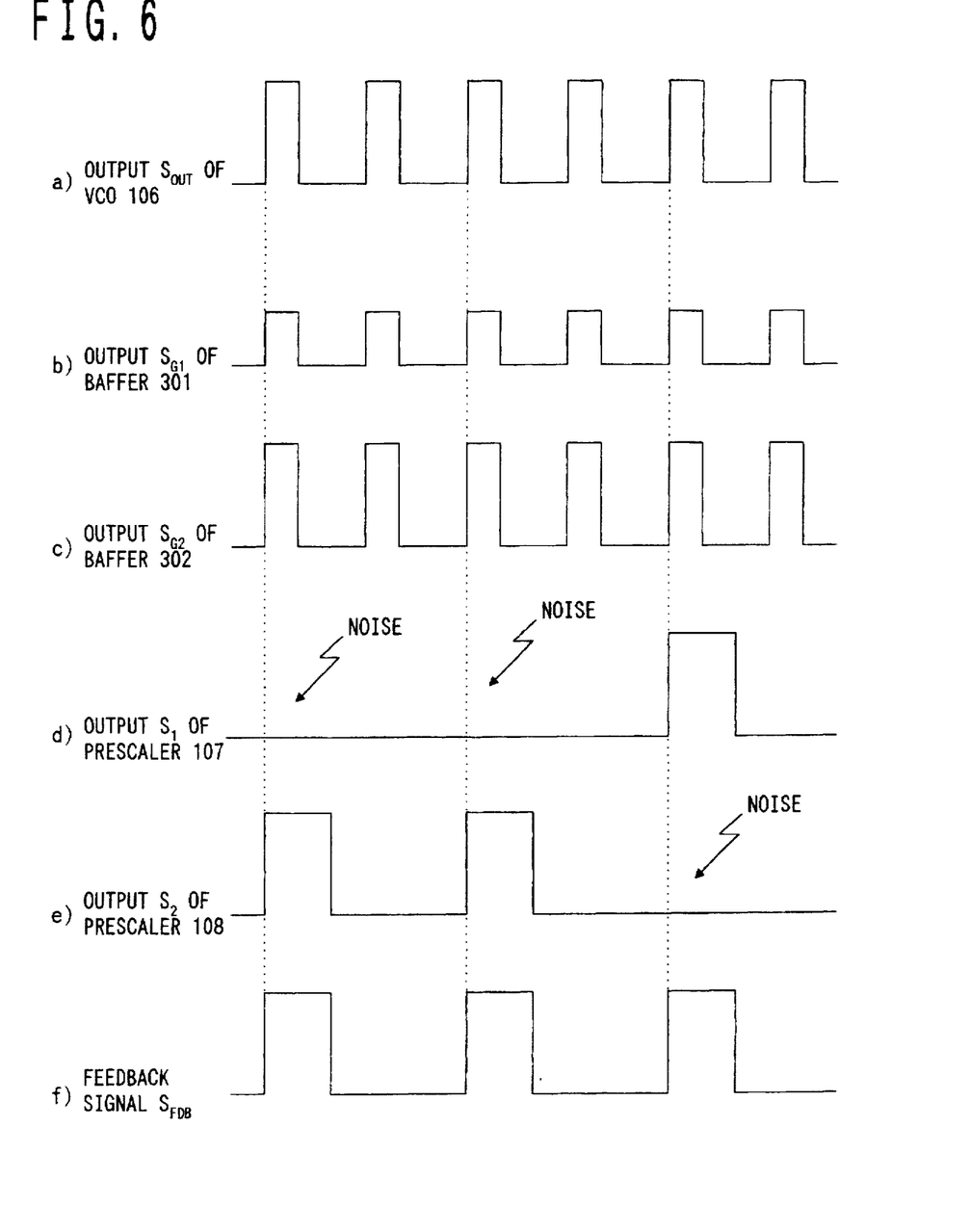
FIG. 6 is a timing chart showing an operation of the third embodiment shown in FIG. 5.

Referring to FIG. 6, the output signal $S_{OUT}$ generated by the VCO 106 is supplied to the amplifiers 301 and 302 which have different gains. Assuming that $G_1$ is 1 and $G_2$ is greater than $G_1$, the amplitude of the output signal $S_{G2}$ is larger than that of the output signal $S_{G1}$. The two output signals $S_{G1}$ and $S_{G2}$ are output to the prescalers 107 and 108 where they are each divided by the same number N (in this figure, N=2) to produce the output signals $S_1$ and $S_2$. When one of the prescalers 107 and 108 is affected by noise, a pulse of that output signal is possibly lacked. However, since the respective output signals $S_1$ and $S_2$ of the prescalers 107 and 108 are ORed by the OR gate 109, a normal feedback signal $S_{PDB}$ is obtained and supplied to the phase comparator 103. Therefore, even when the first feedback circuit is affected by a large noise, the other second feedback circuit probably continues producing the output signal $S_2$. Therefore, the feedback signal $S_{PDB}$ is normally supplied to the phase comparator 103. Further, it is very rare that pulses of both the output signals $S_1$ and $S_2$ are lacked at the same time for a long duration. As a result, the two prescalers in parallel with different input sensitivities remarkably reduce the effect of noise. Further, 15 even when pulses of both the output signals $S_1$ and $S_2$ are lacked at the same time, the duration time is very short, resulting in the reduced response time required until it returns to steady state.

As described above, the PLL circuit according to the present invention is provided with a plurality of feedback circuits connected in parallel through which an output frequency signal is fed back to a phase comparator. Therefore, even when external noises cause the PLL system to go out of the synchronous steady state, the system can return to the steady state in a very short time, achieving improved noise-immunity and frequency stability.

What is claimed is:

1. A phase-locked loop circuit receiving a reference signal and generating an output signal based on a phase difference between the reference signal and a feedback signal, comprising:

a plurality of first feedback circuits in parallel for receiving the output signal and producing a plurality of first output signals;

a second feedback circuit selectively connectable to said output signal for producing a second feedback output signal, and a combining circuit receiving the first and second feedback output signals from the first and second feedback circuits, for combining the first and second feedback output signals to produce the feedback signal.

2. The phase-locked loop circuit according to claim 1, wherein the plurality of first feedback circuits each divide a frequency of the output signal by a predetermined number to produce the first feedback output signals.

3. A phase-locked loop circuit receiving a reference signal and generating an output signal based on a phase difference between the reference signal and a feedback signal, comprising:

a plurality of feedback circuits in parallel receiving the output signal and Producing feedback output signals. Respectively; and a combining circuit receiving the feedback output signals from the feedback circuits, for combining the feedback output signals to produce the feedback signal, wherein the combining circuit performs logical OR of the feedback output signals to produce the feedback signal.

4. A phase-locked loop circuit receiving a reference signal and generating an output signal based on a phase difference between the reference signal and a feedback signal, comprising:

a plurality of feedback circuits in parallel receiving the output signal and producing feedback output signals, respectively;

a combining circuit receiving the feedback output signals from the feedback circuits, for combining the feedback output signals to produce the feedback signal; and a switch connected to a predetermined feedback circuit of the feedback circuits so that the output signal is transferred to the predetermined feedback circuit only when the switch is closed.

5. The phase-locked loop circuit according to claim 4, wherein three feedback circuits are provided in parallel.

6. The phase-locked loop circuit according to claim 2, wherein each of the feedback circuits comprises a prescaler.

7. A phase-locked loop circuit receiving a reference signal and generating an output signal based on a phase difference between the reference signal and a feedback signal, comprising:

a plurality of feedback circuits in parallel receiving the output signal and producing feedback output signals, respectively;

a combining circuit receiving the feedback output signals from the feedback circuits, for combining the feedback output signals to produce the feedback signal; wherein the plurality of feedback circuits have different input sensitivities and each divides a frequency of the output signal by a predetermined number to produce the feedback output signals.

8. The phase-locked loop circuit according to claim 7, wherein each of the feedback circuits excepting a predetermined one comprises an amplifier with different gain and a prescaler connected in series so that the output signal is supplied to the amplifier before the prescaler.

9. A phase-locked loop circuit receiving a reference signal and generating an output signal therefrom, comprising:

a phase comparator for comparing a phase of the reference signal to that of a feedback signal to produce a comparison signal;

a loop filter receiving the comparison signal and producing a control signal;

an oscillator fro generating the output signal depending on the control signal; and a feedback loop circuit connected between the oscillator and the phase comparator, the feedback loop circuit comprising a first feedback circuit selectively connected in parallel to a second feedback circuit; and a combining circuit; the first and second feedback circuits receiving the output signal in parallel and each producing feedback output signals and producing the feedback signal.

10. The phase-locked loop circuit according to claim 9, wherein the plurality of feedback circuits each divide a frequency of the output signal by a predetermined number to produce the feedback output signals.

11. A phase-locked loop circuit receiving a reference signal and generating an output signal therefrom, comprising:
- a phase comparator for comparing a phase of the reference signal to that of a feedback signal to produce a comparison signal;
- a loop filter receiving the comparison signal and producing a control signal;
- an oscillator fro generating the output signal depending on the control signal; and
- a feedback loop circuit connected between the oscillator and the phase comparator, the feedback loop circuit comprising a plurality of feedback circuits in parallel and a combining circuit, the feedback circuits receiving the output signal in parallel and each producing feedback output signals and producing the feedback signal, wherein the combining circuit performs logical OR of the feedback output signals to produce the feedback signal.

12. A phase-locked loop circuit receiving a reference signal and generating an output signal therefrom, comprising:
- a phase comparator for comparing a phase of the reference signal to that of a feedback signal to produce a comparison signal;
- a loop filter receiving the comparison signal and producing a control signal;
- an oscillator fro generating the output signal depending on the control signal;
- a feedback loop circuit connected between the oscillator and the phase comparator, the feedback loop circuit comprising a plurality of feedback circuits in parallel and a combining circuit, the feedback circuits receiving the output signal in parallel and each producing feedback output signals and producing the feedback signal; and
- switch connected between the oscillator and a predetermined feedback circuit of the feedback circuits so that the output signal is transferred to the predetermined feedback circuit only when the switch is closed.

13. A phase-locked loop circuit receiving a reference signal and generating an output signal therefrom, comprising:
- a phase comparator for comparing a phase of the reference signal to that of a feedback signal to produce a comparison signal;
- a loop filter receiving the comparison signal and producing a control signal;
- an oscillator fro generating the output signal depending on the control signal; and
- a feedback loop circuit connected between the oscillator and the phase comparator, the feedback loop circuit comprising a plurality of feedback circuits in parallel and a combining circuit, the feedback circuits receiving the output signal in parallel and each producing feedback output signals and producing the feedback signal; wherein the plurality of feedback circuits have different input sensitivities and each divides a frequency of the output signal by a predetermined number to produce the feedback output signals.

14. A method for producing a feedback signal in a phase-locked loop circuit receiving a reference signal and generating an output signal based on a phase difference between the reference signal and a feedback signal, comprising the steps of:
- branching the output signal into first and second signals;
- dividing the first signal and selectively dividing the second signal in frequency by a predetermined number to produce third and fourth signals, respectively; and
- combining the third and fourth signals to produce the feedback signal.

15. A method for producing a feedback signal in a phase-locked loop circuit receiving a reference signal and generating an output signal based on a phase difference between the reference signal and a feedback signal, comprising the steps of:
- branching the output signal into a plurality of first signals;
- dividing the first signals in frequency by a predetermined number to produce second signals, respectively; and
- combining the second signals to produce the feedback signal, wherein the feedback signal is obtained by performing logical OR of the second signals.

16. A method for producing a feedback signal in a phase-locked loop circuit receiving a reference signal and generating an output signal based on a phase difference between the reference signal and a feedback signal, comprising the steps of:
- branching the output signal into a plurality of first signals;
- dividing the first signals in frequency by a predetermined number to produce second signals, respectively; and
- combining the second signals to produce the feedback signal, wherein the first signals are amplified with different gains before being divided in frequency by the predetermined number.

* * * * *

UNITED STATES PATENT AND TRADEMARK OFFICE
CERTIFICATE OF CORRECTION

PATENT NO. : 5,796,311
DATED : August 18, 1998
INVENTOR(S) : Katsuhiro Ishii, et al.

It is certified that error appears in the above-identified patent and that said Letters Patent are hereby corrected as shown below:

Column 1, Line 11: "in" should read --is--

Column 6, Line 12, Claim 3: "Producing" should read --producing--

Column 6, Line 13, Claim 3: "Respectively" should read --respectively--

Column 6, Line 64, Claim 9: "fro" should read --for--

Column 7, Line 19, Claim 11: "fro" should read --for--

Column 7, Line 39, Claim 12: "fro" should read --for--

Column 7, Line 48, Claim 12: "switch" should read --a switch--

Column 8, Line 7, Claim 13: "fro" should read --for--

Signed and Sealed this

Seventh Day of November, 2000

*Attest:*

Q. TODD DICKINSON

*Attesting Officer*     *Director of Patents and Trademarks*